US010289181B2

(12) United States Patent
Bolt (10) Patent No.: US 10,289,181 B2
(45) Date of Patent: May 14, 2019

(54) SWITCHES COUPLING VOLATILE MEMORY DEVICES TO A POWER SOURCE

(71) Applicant: HEWLETT PACKARD ENTERPRISE DEVELOPMENT LP, Houston, TX (US)

(72) Inventor: Matthew T. Bolt, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 87 days.

(21) Appl. No.: 15/303,472

(22) PCT Filed: Apr. 29, 2014

(86) PCT No.: PCT/US2014/035810
§ 371 (c)(1),
(2) Date: Oct. 11, 2016

(87) PCT Pub. No.: WO2015/167449
PCT Pub. Date: Nov. 5, 2015

(65) Prior Publication Data
US 2017/0031408 A1    Feb. 2, 2017

(51) Int. Cl.
*G06F 1/26* (2006.01)
*G06F 1/28* (2006.01)
(Continued)

(52) U.S. Cl.
CPC .............. *G06F 1/28* (2013.01); *G06F 1/263* (2013.01); *G06F 3/065* (2013.01); *G06F 3/0619* (2013.01);
(Continued)

(58) Field of Classification Search
CPC .......... G06F 1/28; G06F 3/0685; G06F 1/263; G06F 3/0619; G06F 3/065; G11C 5/04; G11C 5/148; G11C 8/12; G11C 11/4074
See application file for complete search history.

(56) References Cited

U.S. PATENT DOCUMENTS

| 6,204,574 | B1 * | 3/2001 | Chi | ...................... G06F 1/263 |
| | | | | 307/43 |
| 6,484,299 | B1 * | 11/2002 | Larsen | ...................... G11C 5/04 |
| | | | | 327/277 |

(Continued)

OTHER PUBLICATIONS

Webopedia, "FPGA", Oct. 1, 2002, pp. 1-2, https://www.webopedia.com/TERM/F/FPGA.html (Year: 2002).*

(Continued)

*Primary Examiner* — Christopher D Birkhimer
(74) *Attorney, Agent, or Firm* — Nolte Intellectual Property Law Group (57) ABSTRACT

Example implementations relate to coupling volatile memory devices to a power source. In example implementations, data may be copied from a first volatile memory device on a memory module to non-volatile memory. The first volatile memory device may cease to be powered after data is copied from the first volatile memory device to non-volatile memory. After the first volatile memory device has ceased to be powered, data may be copied from a second volatile memory device on the memory module to non-volatile memory. The second volatile memory device may cease to be powered after data is copied from the second volatile memory device to non-volatile memory.

20 Claims, 8 Drawing Sheets

(51) Int. Cl.
    *G06F 3/06*               (2006.01)
    *G11C 11/4074*       (2006.01)
    *G11C 5/04*             (2006.01)
    *G11C 5/14*             (2006.01)
    *G11C 8/12*             (2006.01)

(52) U.S. Cl.
    CPC .............. *G06F 3/0685* (2013.01); *G11C 5/04*
        (2013.01); *G11C 5/148* (2013.01); *G11C 8/12*
              (2013.01); *G11C 11/4074* (2013.01)

(56) References Cited

U.S. PATENT DOCUMENTS

| | | | | |
|---|---|---|---|---|
| 6,570,814 | B2* | 5/2003 | Farmwald | G06F 11/006 365/233.1 |
| 6,584,037 | B2* | 6/2003 | Farmwald | G06F 11/006 365/233.16 |
| 6,598,171 | B1* | 7/2003 | Farmwald | G06F 11/006 713/401 |
| 6,684,285 | B2* | 1/2004 | Farmwald | G11C 29/88 365/189.15 |
| 6,697,295 | B2* | 2/2004 | Farmwald | G06F 11/006 365/189.15 |
| 6,715,020 | B2* | 3/2004 | Farmwald | G11C 29/88 365/233.11 |
| 6,728,819 | B2* | 4/2004 | Farmwald | G11C 29/88 365/189.02 |
| 6,751,696 | B2* | 6/2004 | Farmwald | G11C 29/88 365/194 |
| 6,807,598 | B2* | 10/2004 | Farmwald | G11C 29/88 365/189.02 |
| 6,817,002 | B2* | 11/2004 | Larsen | G11C 5/04 333/142 |
| 6,975,558 | B2* | 12/2005 | Farmwald | G06F 11/006 365/233.16 |
| 7,110,322 | B2* | 9/2006 | Farmwald | G06F 11/006 365/189.15 |
| 7,196,938 | B1 | 3/2007 | Wu et al. | |
| 7,209,997 | B2* | 4/2007 | Farmwald | G11C 29/88 365/189.17 |
| 7,426,649 | B2 | 9/2008 | Brittain et al. | |
| 8,080,900 | B2* | 12/2011 | Corhodzic | G06F 1/263 307/66 |
| 8,320,202 | B2* | 11/2012 | Ware | G11C 5/04 365/191 |
| 8,391,039 | B2* | 3/2013 | Ware | G11C 5/04 365/191 |
| 8,624,433 | B2* | 1/2014 | Whitted | H02J 9/061 307/64 |
| 2003/0142574 | A1 | 7/2003 | Floro et al. | |
| 2006/0080515 | A1* | 4/2006 | Spiers | G06F 11/1441 711/162 |
| 2009/0031072 | A1 | 1/2009 | Sartore | |
| 2009/0206670 | A1* | 8/2009 | Whitted | H02J 9/061 307/64 |
| 2010/0162020 | A1 | 6/2010 | Maule et al. | |
| 2010/0202238 | A1 | 8/2010 | Moshayedi et al. | |
| 2010/0202239 | A1 | 8/2010 | Moshayedi et al. | |
| 2012/0056481 | A1* | 3/2012 | Corhodzic | G06F 1/263 307/66 |
| 2012/0292988 | A1* | 11/2012 | Nishida | B60R 16/03 307/10.1 |
| 2013/0111111 | A1 | 5/2013 | Sartore | |
| 2013/0148457 | A1 | 6/2013 | Sweere et al. | |
| 2013/0254497 | A1 | 9/2013 | Chen et al. | |
| 2017/0308442 | A1* | 10/2017 | Bolt | G06F 11/1441 |

OTHER PUBLICATIONS

National Instruments, "Introduction to FPGA Technology: Top 5 Benefits", Apr. 16, 2012, pp. 1-2, http://www.ni.com/white-paper/6984/en/ (Year: 2012).*
Helmuth Spieler, "VIII.5. Noise in Transistors", 1998, pp. 1-28, http://www-physics.lbl.gov/~spieler/physics_198_notes/PDF/VIII-5-noise.pdf (Year: 1998).*
Margaret Rouse, "Field-Effect Transistor (FET)", Feb. 18, 2014, pp. 1-10, https://web.archive.org/web/20140218204258/http://whatis.techtarget.com/definition/field-effect-transistor-FET (Year: 2014).*
Anonymous, "Wires", 2005, pp. 1-26, https://ocw.mit.edu/courses/electrical-engineering-and-computer-science/6-884-complex-digital-systems-spring-2005/lecture-notes/104_wires.pdf (Year: 2005).*
Anonymous, "Electric Current", Jul. 5, 2007, pp. 1-2, https://web.archive.org/web/20070705195924/http://resources.schoolscience.co.uk/CDA/16plus/copelech2pg1.html (Year: 2007).*
Mark Balch, "Complete Digital Design: A Comprehensive Guide to Digital Electronics and Computer Architecture", McGraw-Hill, 2003, pp. 1-481, https://theswissbay.ch/pdf/Gentoomen%20Library/Digital%20Design/Complete%20Digital%20Design.pdf (Year: 2003).*
Stas Bekman, "What is Propagation Delay?", Jan. 29, 2008, pp. 1-2, https://web.archive.org/web/20080129110831/https://stason.org/TULARC/networking/lans-ethernet/3-11-What-is-propagation-delay-Ethernet-Physical-Layer.html (Year: 2008).*
Gottscho, M. et al., "Analyzing Power Variability of DDR3 Dual Inline Memory Modules," (Research Paper), Sep. 1, 2011, 12 pages, available at http://nanocad.ee.ucla.edu/pub/Main/Publications/UG2_paper.pdf.
International Search Report & Written Opinion received in PCT Application No. PCT/US2014/035810, dated Jan. 19, 2015, 12 pages.

* cited by examiner

SWITCHES COUPLING VOLATILE MEMORY DEVICES TO A POWER SOURCE

BACKGROUND

Memory modules may include volatile memory and non-volatile memory. When a main power supply that powers a memory module is no longer stable, a backup power source may be used to power the memory module, and a data backup may be performed. During data backup, data may be copied from volatile memory to non-volatile memory.

BRIEF DESCRIPTION OF THE DRAWINGS

The following detailed description references the drawings, wherein.

DETAILED DESCRIPTION

As mentioned above, a data backup may be performed when a main power supply that powers a memory module is no longer stable. During data backup, a backup power supply on the memory module may be used to power the memory module. To prevent loss of data, the backup power supply should be able to last until data from all volatile memory devices on the memory module have been copied to non-volatile memory.

Power consumed during data backup may be reduced by ceasing to power volatile memory devices one by one as the copying of their data to non-volatile memory is completed, rather than powering all volatile memory devices for the entirety of the data backup operation and then ceasing to power all volatile memory devices at the same time after data backup has been completed. A reduction in the amount of energy needed for a backup power source may reduce the mechanical size and cost of the backup power source, and may allow for a reduction of size of the memory module. Memory modules may be used inside servers, and a reduction of the size of memory modules in a server may alleviate cooling and space constraints.

Figure 1:
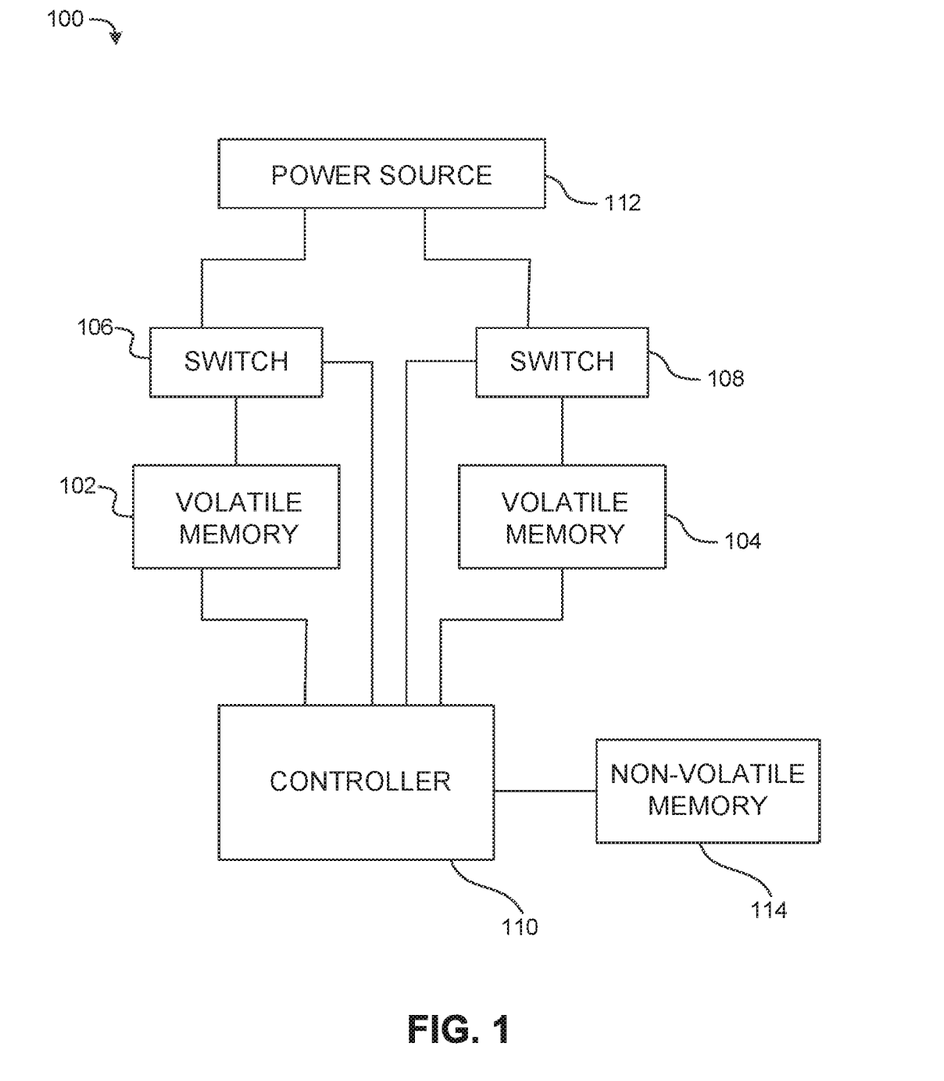
FIG. 1 is a block diagram of an example system for saving power during data backup.

Referring now to the drawings, FIG. 1 is a block diagram of an example system 100 for saving power during data backup. System 100 may be implemented on a memory module, such as a single in-line memory module (SIMM) or a dual in-line memory module (DIMM). In FIG. 1, system 100 includes volatile memory devices 102 and 104, switches 106 and 108, controller 110, power source 112, and non-volatile memory 114. As used herein, the terms "include", "have", and "comprise" are interchangeable and should be understood to have the same meaning.

Volatile memory devices 102 and 104 may each include a random access memory (RAM) device, such as a dynamic random access memory (DRAM) device. Volatile memory devices 102 and 104 may contain or store executable instructions and/or data for analysis by a processor. Data may be written to and read from volatile memory devices 102 and 104.

Switch 106 may be connected to volatile memory device 102, and switch 108 may be connected to volatile memory device 104. Switches 106 and 108 may each include a bipolar junction transistor (BJT), an insulated gate bipolar transistor (IGBT), or a field-effect transistor (FET), such as a metal-oxide-semiconductor field-effect transistor (MOSFET), junction field-effect transistor (JFET), or metal-semiconductor field-effect transistor (MESFET), or any suitable switching device. Switches 106 and 108, when closed, may couple volatile memory devices 102 and 104, respectively, to power source 112. Data stored on volatile memory device 102 or 104 may be lost if the respective volatile memory device is decoupled or disconnected from power source 112 (e.g., if switch 106 or 108 is opened). In some implementations, power source 112 may include an alternating current (AC) power source. In some implementations, power source 112 may include a battery or a supercapacitor.

Controller 110 may be communicatively coupled to volatile memory devices 102 and 104 and switches 106 and 108. Controller 110 may be a memory module controller that controls access to memories (e.g., volatile memory devices 102 and 104, and non-volatile memory 114) on a memory module (e.g., a SIMM or DIMM). In some implementations, controller 110 may include a field programmable gate array (FPGA). In some implementations, controller 110 may include a double data rate (DDR) buffer, such as a double data rate type three (DDR3) buffer or a double data rate fourth generation (DDR4) buffer.

Controller 110 may open switch 106 after data is copied from volatile memory device 102 to non-volatile memory 114. Non-volatile memory 114 may include an electrically erasable programmable read-only memory (EEPROM), a flash memory, and/or other memory that retains stored data even when not powered. In some implementations, non-volatile memory 114 may include multiple non-volatile memory devices (e.g., multiple flash memory devices). Controller 110 may copy data from volatile memory device 104 to non-volatile memory 114 after switch 106 is opened.

Although two volatile memory devices are shown in FIG. 1, it should be understood that system 100 may include additional volatile memory devices, each connected to a switch that, when closed, couples the respective volatile memory device to power source 112. For example, system 100 may include a third volatile memory device in addition to volatile memory devices 102 and 104, and a third switch, in addition to switches 106 and 108, connected to the third volatile memory device. In some implementations, power source 112 may be a backup power source, and volatile memory devices in system 100 (e.g., volatile memory devices 102 and 104 and the third volatile memory device) may be coupled to the backup power source when a main power source ceases to power the volatile memory devices in system 100. Switches 106 and 108 and the third switch may, when closed, couple volatile memory devices 102 and 104 and the third volatile memory device, respectively, to the backup power source. Controller 110 may open switch 108 after data is copied from volatile memory 104 to non-volatile memory 114. Data may be copied from the third volatile memory device to non-volatile memory 114 after switch 108 is opened.

Data may be copied from volatile memory devices (e.g., volatile memory devices 102 and 104, the third volatile memory device) of system 100 to non-volatile memory 114 during a data backup. A volatile memory device may be powered by power source 112 (e.g. a switch between the volatile memory device and power source 112 may be closed) before data is copied from the volatile memory device to non-volatile memory 114, and while data is being copied from the volatile memory device to non-volatile memory 114, as data stored on the volatile memory device may be lost if the volatile memory device ceases to be powered. After data is copied from a volatile memory device to non-volatile memory 114, the volatile memory device may cease to be powered (e.g., controller 110 may open a switch between the volatile memory device and power source 112). By ceasing to power volatile memory devices whose data have been copied to non-volatile memory 114 while other volatile memory devices whose data have not been copied continue to be powered, power (e.g., stored in a battery or supercapacitor) may be conserved in system 100.

Although power source 112 is shown as a single element in FIG. 1, it should be understood that power source 112 may be implemented as multiple power sources on a memory module (e.g., a first group of volatile memory devices may be coupled to a first battery, and a second group of volatile memory devices may be coupled to a second battery). In some implementations, power source 112 may include a main power source (e.g., AC power source) and a backup power source (e.g., battery or supercapacitor). When a memory module on which system 100 is implemented is powered on, switches in system 100 may be closed and may couple volatile memory devices in system 100 to the main power source. If the main power source ceases to power the volatile memory devices (e.g., if the main power source is turned off or disconnected from the memory module), the volatile memory devices may be coupled to the backup power source. For example, if the main power source ceases to power the volatile memory devices, an internal switch within power source 112 may be flipped such that the volatile memory devices are coupled to the backup power source instead of the main power source. Data backup may begin after the volatile memory devices are coupled to the backup power source, and switches coupling the volatile memory devices to the backup power source may be opened one by one as the copying of data from the respective volatile memory devices to non-volatile memory is completed.

Figure 2:
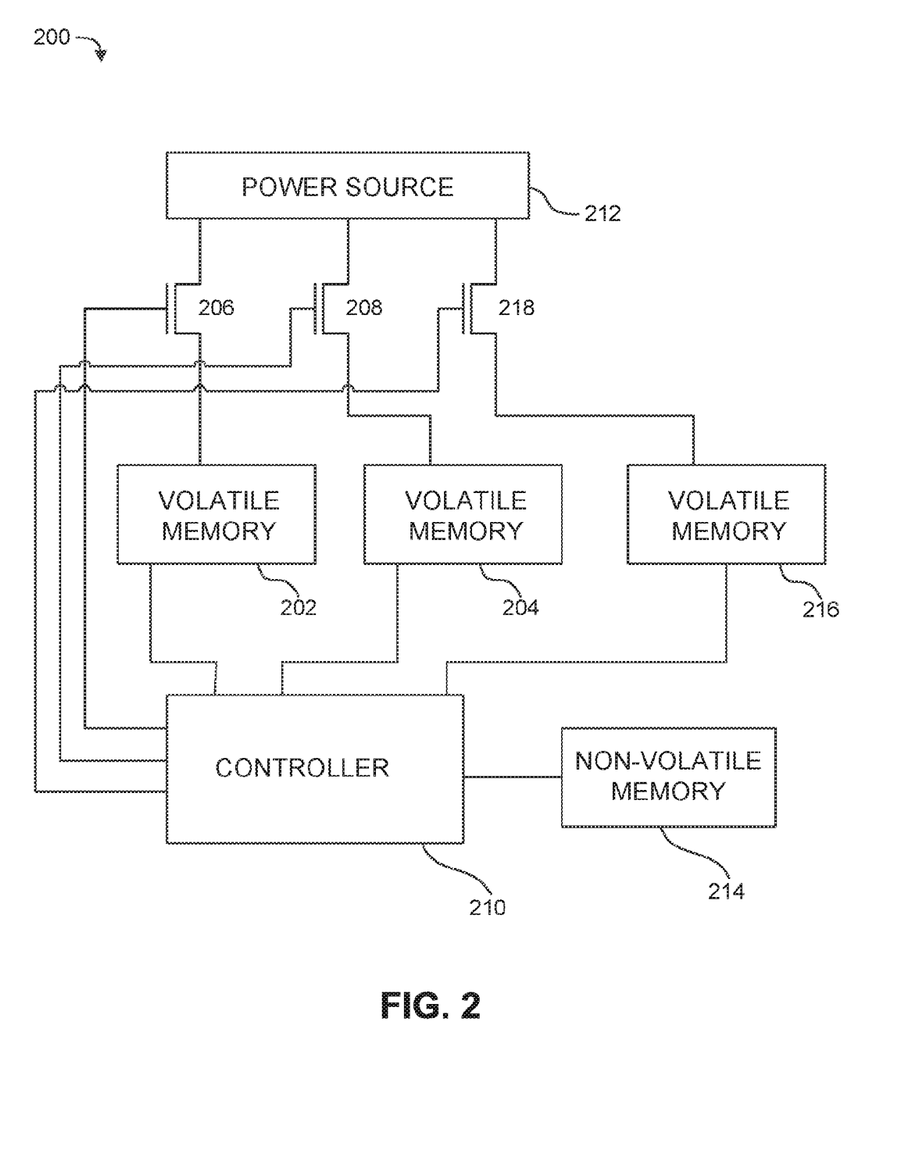
FIG. 2 is a block diagram of an example system that includes field-effect transistor (FET) switches that couple volatile memory devices to a power source.

FIG. 2 is a block diagram of an example system 200 that includes FET switches that couple volatile memory devices to a power source. System 200 may be implemented on a memory module, such as a SIMM or DIMM. In FIG. 2, system 200 includes volatile memory devices 202, 204, and 216; FET switches 206, 208, and 218; controller 210; power source 212; and non-volatile memory 214. Controller 210, power source 212, and non-volatile memory 214 of FIG. 2 may be analogous to (e.g., have functions and/or components similar to) controller 110, power source 112, and non-volatile memory 114, respectively, of FIG. 1.

Volatile memory devices 202, 204, and 216 may each include a RAM device, such as a DRAM device. Volatile memory devices 202, 204, and 216 may contain or store executable instructions and/or data for analysis by a processor. Data may be written to and read from volatile memory devices 202, 204, and 216.

FETs 206, 208, and 218 may be connected to volatile memory devices 202, 204, and 216, respectively. For example, drain terminals of FETs 206, 208, and 218 may be connected to volatile memory devices 202, 204, and 216, respectively, and source terminals of FETs 206, 208, and 218 may be connected to power source 212, or vice-versa. Gate terminals of FETs 206, 208, and 218 may be connected to controller 210, which may control gate voltages of the FETs.

FETs 206, 208, and 218 may function as switches that, when closed, couple volatile memory devices 202, 204, and 216, respectively, to power source 212; FETs 206, 208, and 218 may each function as a closed switch when controller 210 sets the respective gate voltages at a first value, and may each function as an open switch when controller 210 sets the respective gate voltages at a second value. Different FETs may have different gate voltages at any given time (e.g., at a given time, FET 206 may have a gate voltage at the second value, and FETs 208 and 218 may have respective gate voltages at the first value). Data stored on volatile memory device 202, 204, or 216 may be lost if the respective volatile memory device is decoupled or disconnected from power source 212 (e.g., if gate voltages of FETs 206, 208, or 218 are such that the respective FET functions as an open switch between power source 212 and the respective volatile memory device).

Controller 210 may change the gate voltage of FET 206 from a first value to a second value after copying of data from volatile memory device 202 to non-volatile memory 214 has been completed (e.g., during data backup). FET 206 may function as a closed switch (e.g., FET 206 may couple volatile memory device 202 to power source 212) when its gate voltage is at the first value, and may function as an open switch (e.g., volatile memory device 202 may be decoupled from power source 212) when its gate voltage is at the second value. After the gate voltage of FET 206 is changed to the second value, FETs 208 and 218 may continue to function as closed switches (e.g., the gate voltages of FETs 208 and 218 may remain at the first value) as data is copied from volatile memory device 204 to non-volatile memory 214. When copying of data from volatile memory device 204 to non-volatile memory 214 has been completed, controller 210 may change the gate voltage of FET 208 (e.g., from the first value to the second value) such that FET 208 goes from functioning as a closed switch to functioning as an open switch. After the gate voltage of FET 208 is changed, data may be copied from volatile memory device 216 to non-volatile memory 214. FET 218 may continue to function as a closed switch (e.g., the gate voltage of FET 218 may remain at the first value) as data is copied from volatile memory device 216 to non-volatile memory 214. When copying of data from volatile memory device 216 to non-volatile memory 214 has been completed, controller 210 may change the gate voltage of FET 218 (e.g., from the first value to the second value) such that FET 218 goes from functioning as a closed switch to functioning as an open switch.

Although three volatile memory devices are shown in FIG. 2, it should be understood that system 200 may include additional volatile memory devices, each connected to a FET switch that, when closed, couples the respective volatile memory device to power source 212. In some implementations, power source 212 may be a backup power source, and volatile memory devices in system 200 may be coupled to the backup power source when a main power source ceases to power the volatile memory devices in system 200. Data may be copied from volatile memory devices (e.g., volatile memory devices 202, 204, and 216) of system 200 to non-volatile memory 214 during a data backup, in a manner similar to that discussed above with respect to FIG. 1.

Figure 3:
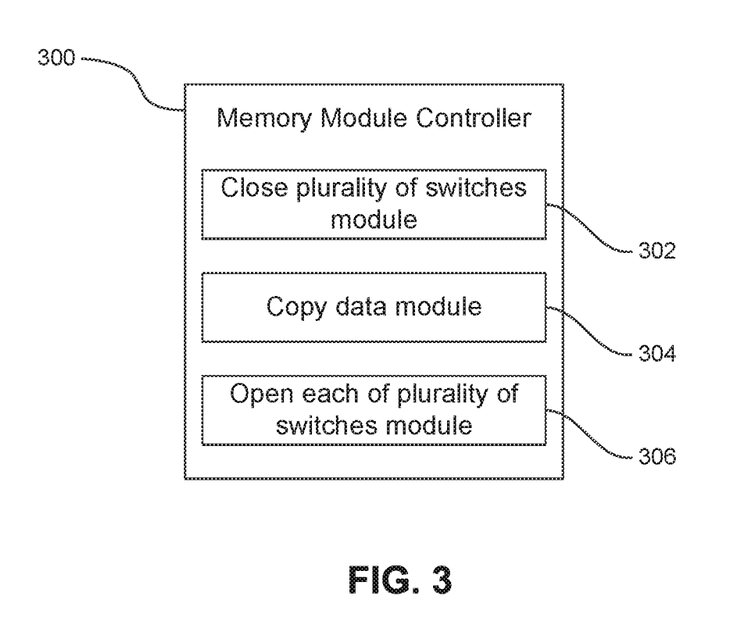
FIG. 3 is a block diagram of an example memory module controller to enable saving power during data backup.

FIG. 3 is a block diagram of an example memory module controller 300 to enable saving power during data backup. Memory module controller 300 may control access to memory devices (e.g., volatile memory devices and non-volatile memory) on a memory module (e.g., SIMM or DIMM). Memory module controller 300 may be an implementation of controller 110 of FIG. 1 or controller 210 of FIG. 2.

As illustrated in FIG. 3, memory module controller 300 may include modules 302, 304, and 306. A module may include a set of instructions encoded on a machine-readable storage medium and executable by a processor of memory module controller 300. In addition or as an alternative, a module may include a hardware device comprising electronic circuitry for implementing the functionality described below.

Module 302 may close a plurality of switches on a memory module. Each of the plurality of switches may be connected to a respective one of a plurality of volatile memory devices on the memory module. In some implementations, the plurality of volatile memory devices may include RAM devices, such as DRAM devices. Each of the plurality of switches, when closed, may couple the respective volatile memory device to a power source. In some implementations, the power source may include a battery or a supercapacitor.

In some implementations, the power source may be a backup power source. The plurality of volatile memory devices may be coupled to the backup power source when a main power source ceases to power the plurality of volatile memory devices. In some implementations, the power source may include a main power source (e.g., AC power source) and a backup power source (e.g., battery or supercapacitor). When a memory module on which memory module controller 300 is implemented is powered on, switches on the memory module may be closed and may couple volatile memory devices on the memory module to the main power source. If the main power source ceases to power the volatile memory devices (e.g., if the main power source is turned off or disconnected from the memory module), the volatile memory devices may be coupled to the backup power source. For example, if the main power source ceases to power the volatile memory devices, an internal switch within the power source may be flipped such that the volatile memory devices are coupled to the backup power source instead of the main power source.

Module 304 may copy data from the plurality of volatile memory devices to non-volatile memory. For example, data may be copied from volatile memory devices 102 and 104 to non-volatile memory 114. Data may be copied from the plurality of volatile memory devices to non-volatile memory during a data backup. A data backup may be performed to prevent data stored in the plurality of volatile memory devices from being lost if the main power to the memory module is disconnected or disrupted.

Module 306 may open each of the plurality of switches after data is copied from the respective volatile memory device to non-volatile memory. Switches connected to volatile memory devices, whose data has already been copied to non-volatile memory, may be open. Switches connected to volatile memory devices, whose data has not yet been copied to non-volatile memory, may be closed.

For example, a switch between a volatile memory device and a power source may be closed before data is copied from the volatile memory device to non-volatile memory, and while data is being copied from the volatile memory device to non-volatile memory, as data stored on the volatile memory device may be lost if the volatile memory device ceases to be powered. After data is copied from a volatile memory device to non-volatile memory, a switch between the volatile memory device and the power source may be opened, and switches between other volatile memory devices whose data have not been copied may remain closed. As copying of data from such other volatile memory devices to non-volatile memory is completed, their respective switches may be opened. By ceasing to power volatile memory devices whose data have been copied to non-volatile memory while other volatile memory devices whose data have not been copied continue to be powered, power (e.g., stored in a battery or supercapacitor) may be conserved in the memory module.

Figure 4:
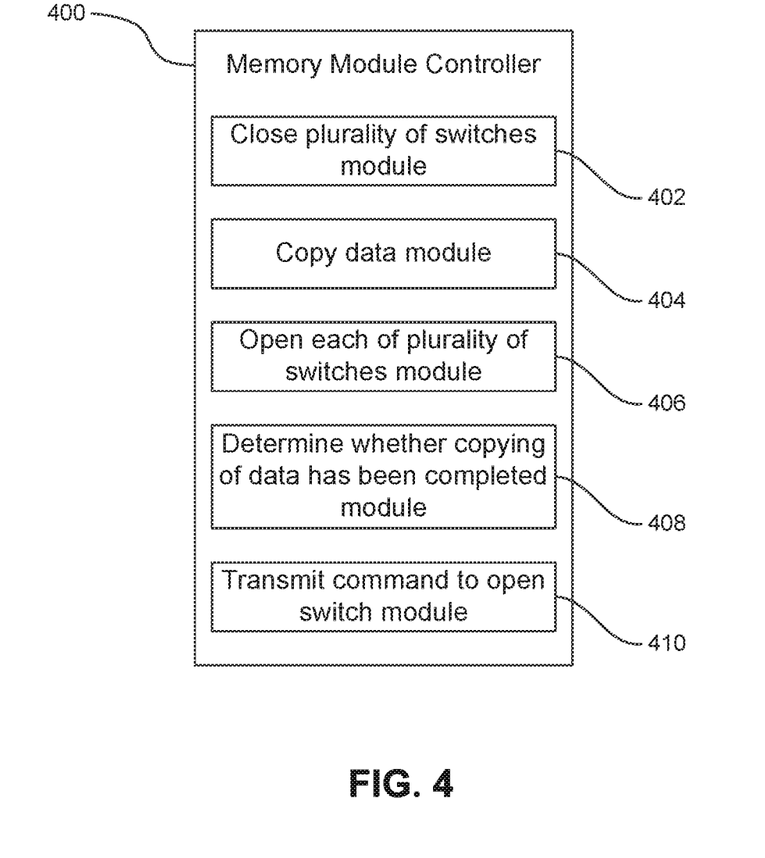
FIG. 4 is a block diagram of an example memory module controller to transmit a command to open a switch after copying of data from a volatile memory device to non-volatile memory is completed.

FIG. 4 is a block diagram of an example memory module controller 400 to transmit a command to open a switch after copying of data from a volatile memory device to non-volatile memory is completed. Memory module controller 400 may control access to memory devices (e.g., volatile memory devices and non-volatile memory) on a memory module (e.g., SIMM or DIMM). Memory module controller 400 may be an implementation of controller 110 of FIG. 1 or controller 210 of FIG. 2.

As illustrated in FIG. 4, memory module controller 400 may include modules 402, 404, 406, 408, and 410. A module may include a set of instructions encoded on a machine-readable storage medium and executable by a processor of memory module controller 400. In addition or as an alternative, a module may include a hardware device comprising electronic circuitry for implementing the functionality described below.

Modules 402, 404, and 406 of memory module controller 400 may be analogous to modules 302, 304, and 306 of memory module controller 300. Module 408 may determine whether copying of data from one of a plurality of volatile memory devices to non-volatile memory has been completed. In some implementations, module 408 may determine whether the full range of addresses of the one of the plurality of volatile memory devices has been read. In some implementations, memory module controller 400 may store (e.g., be programmed with) the capacity of the one of the plurality of volatile memory devices, and module 408 may determine whether the amount of data that has been copied from the one of the plurality of volatile memory devices to non-volatile memory is equal to the capacity. Each of the plurality of volatile memory devices may be connected to a respective switch on a memory module.

Module 410 may transmit, in response to a determination that copying of data from the one of the plurality of volatile memory devices to non-volatile memory has been completed, a command to open the respective switch connected to the one of the plurality of volatile memory devices. The opening of the respective switch may cause the one of the plurality of volatile memory devices to be decoupled from a power source. It should be understood that actions performed by modules 408 and 410 may be performed for each of a plurality of volatile memory devices on a memory module on which memory module controller 400 is implemented.

Figure 5:
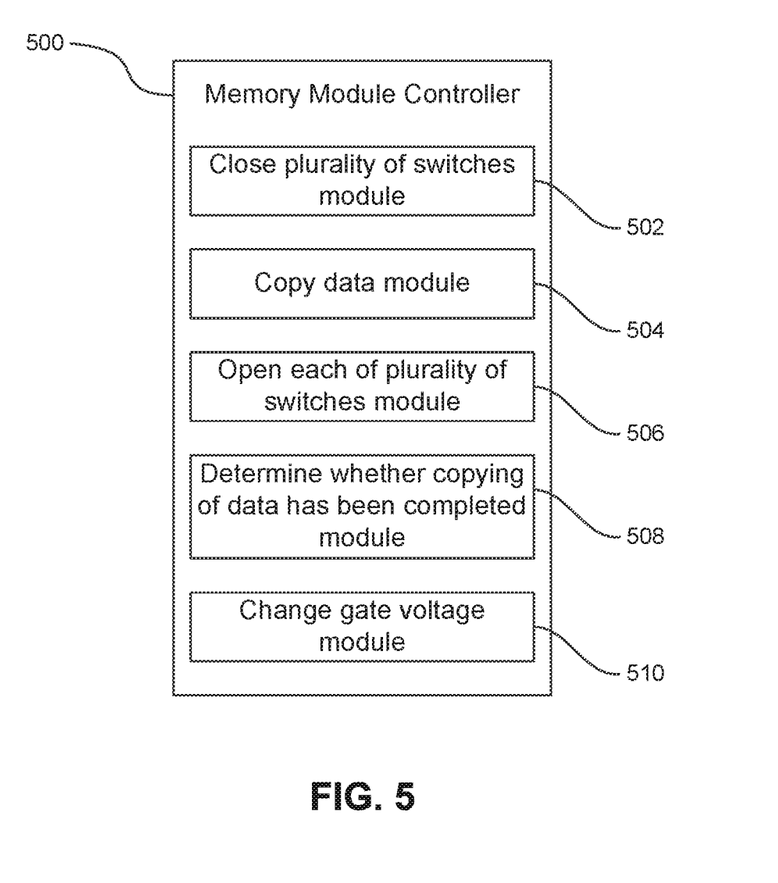
FIG. 5 is a block diagram of an example memory module controller to change a gate voltage of a FET.

FIG. 5 is a block diagram of an example memory module controller 500 to change a gate voltage of a FET. Memory module controller 500 may control access to memory devices (e.g., volatile memory devices and non-volatile memory) on a memory module (e.g., SIMM or DIMM). The memory module may include a plurality of switches, and each of a plurality of volatile memory devices on the memory module may be connected to a respective switch. The plurality of switches may include FETs. Memory module controller 500 may be an implementation of controller 110 of FIG. 1 or controller 210 of FIG. 2.

As illustrated in FIG. 5, memory module controller 500 may include modules 502, 504, 506, 508, and 510. A module may include a set of instructions encoded on a machine-readable storage medium and executable by a processor of memory module controller 500. In addition or as an alternative, a module may include a hardware device comprising electronic circuitry for implementing the functionality described below.

Modules 502, 504, and 506 of memory module controller 500 may be analogous to modules 302, 304, and 306 of memory module controller 300. Module 508 of memory module controller 500 may be analogous to module 408 of memory module controller 400. Module 510 may change, in response to a determination that copying of data from one of the plurality of volatile memory devices to non-volatile memory has been completed, a gate voltage of a FET connected to the one of the plurality of volatile memory devices. For example, module 510 may change the gate voltage of the FET from a first value to a second value. The FET may function as a closed switch (e.g., the FET may couple the one of the plurality of volatile memory devices to a power source) when its gate voltage is at the first value, and may function as an open switch (e.g., the one of the plurality of volatile memory devices may be decoupled from the power source) when its gate voltage is at the second value. It should be understood that actions performed by modules 508 and 510 may be performed for each of a plurality of volatile memory devices on a memory module on which memory module controller 500 is implemented.

Figure 6:
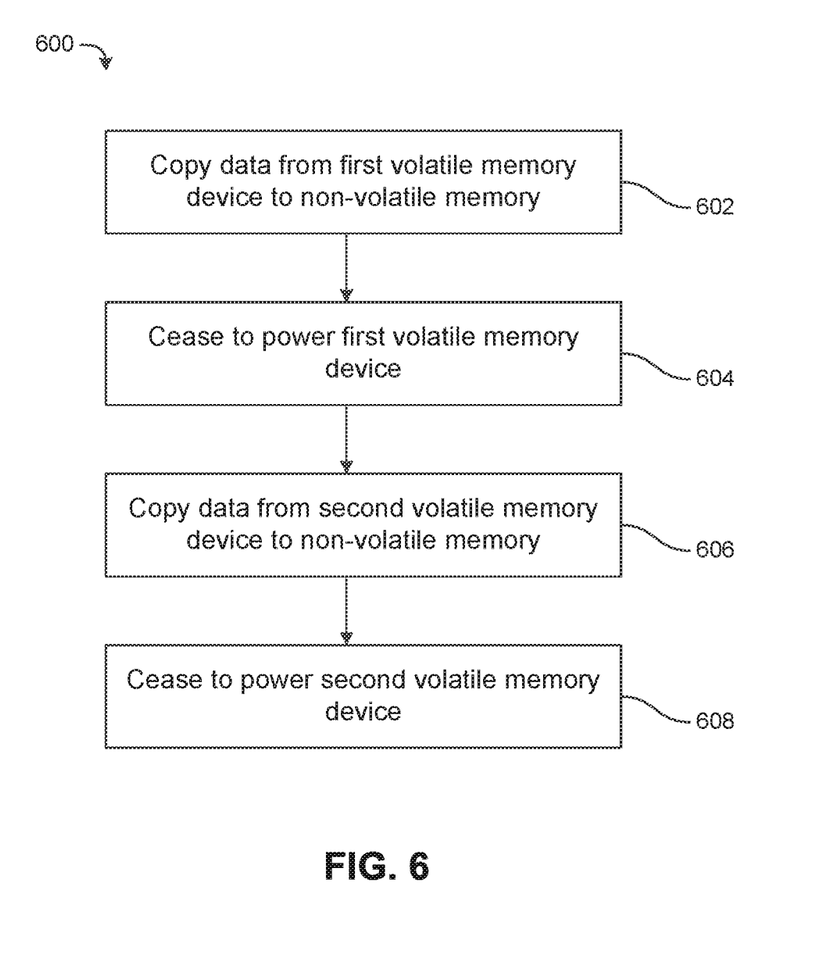
FIG. 6 is a flowchart of an example method for saving power during data backup.
Figure 7:
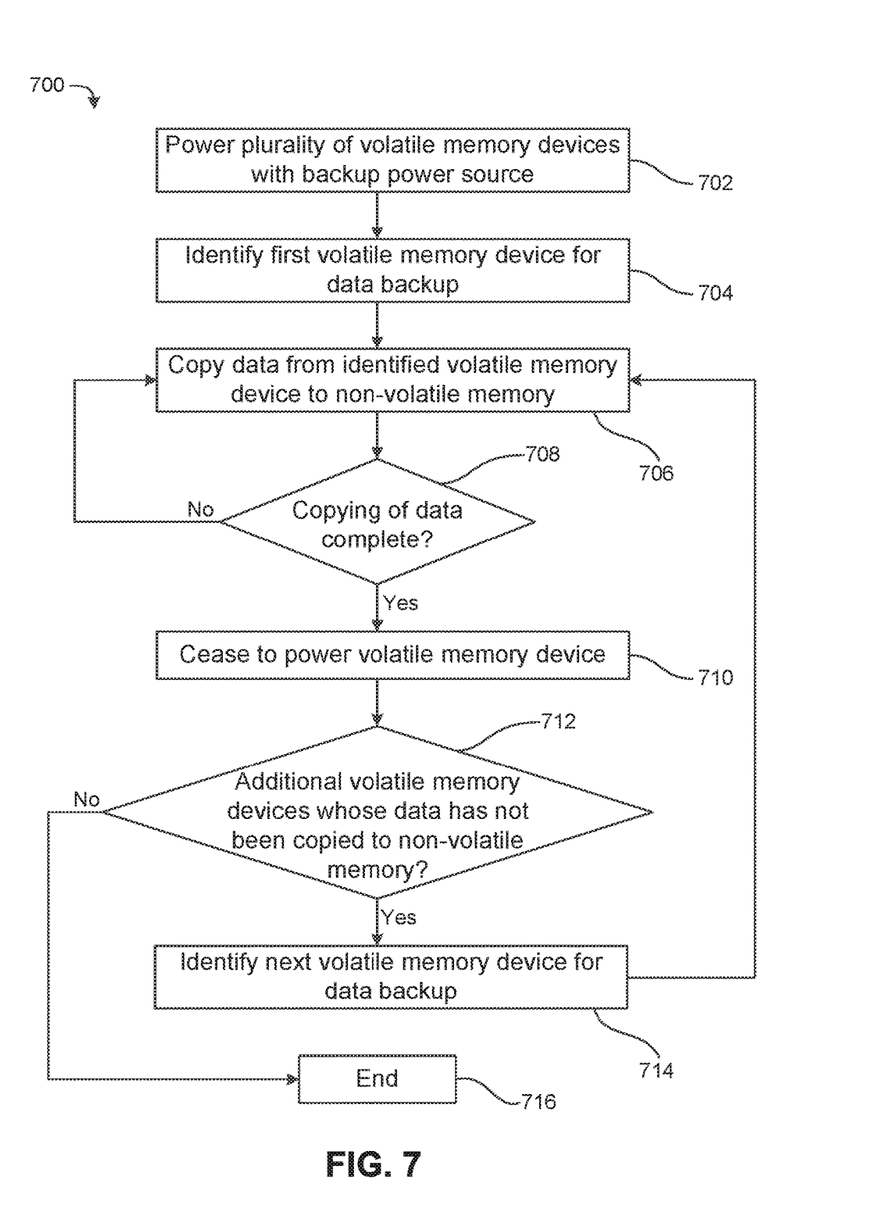
FIG. 7 is a flowchart of an example method for determining when to cease power to a volatile memory device.
Figure 8:
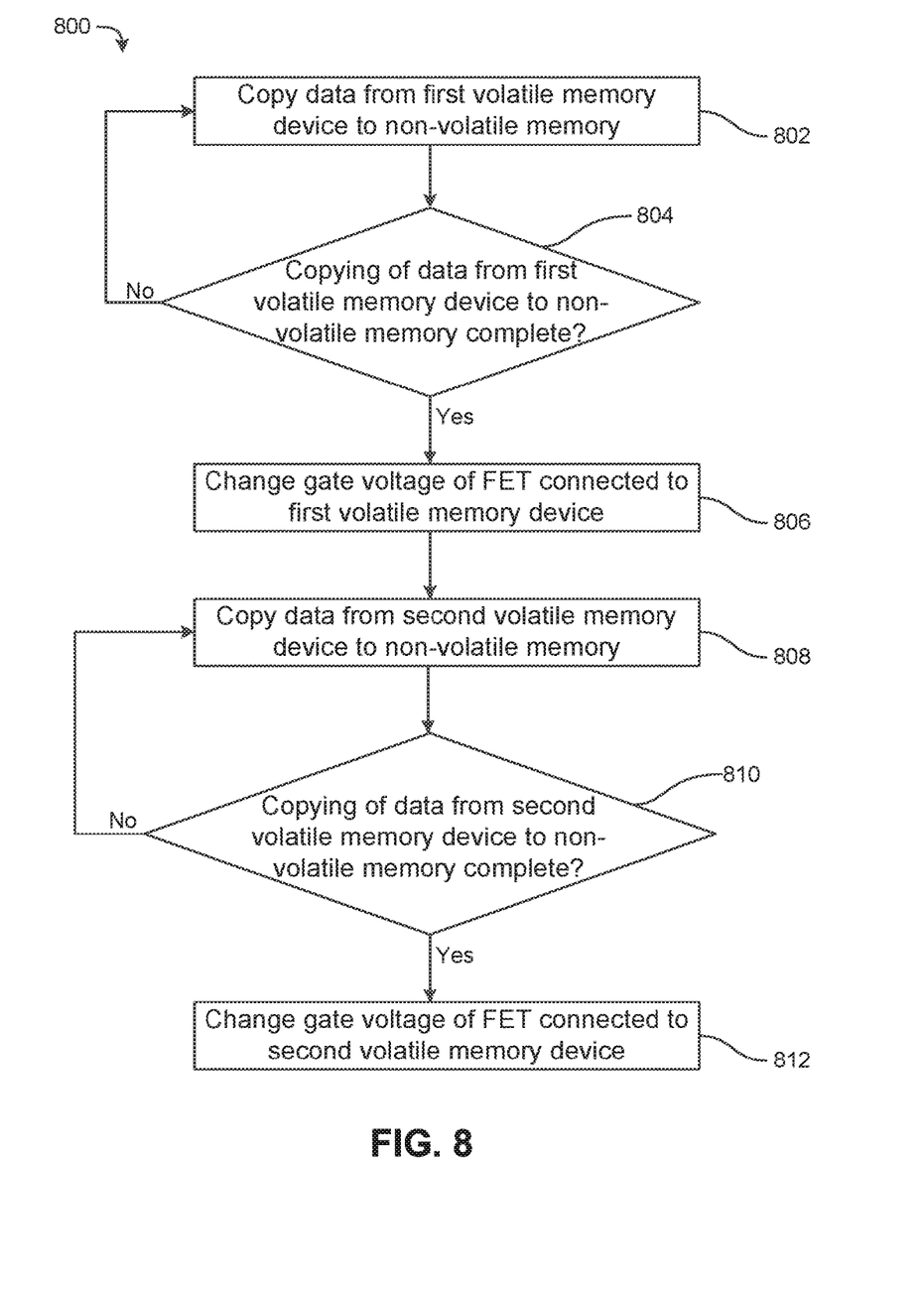
FIG. 8 is a flowchart of an example method for determining when to change a gate voltage of a FET.

Methods related to conserving power on memory modules are discussed with respect to FIGS. 6-8. FIG. 6 is a flowchart of an example method 600 for saving power during data backup. Although execution of method 600 is described below with reference to memory module controller 300 of FIG. 3, it should be understood that execution of method 600 may be performed by other suitable devices, such as memory module controllers 400 and 500 of FIGS. 4 and 5, respectively. Method 600 may be implemented in the form of executable instructions stored on a machine-readable storage medium and/or in the form of electronic circuitry.

Method 600 may start in block 602, where memory module controller 300 may copy data from a first volatile memory device on a memory module to non-volatile memory. For example, data may be copied from volatile memory device 102 to non-volatile memory 114. The first volatile memory device may be connected to a first switch. The first switch, when closed, may couple the first volatile memory device to a power source.

Next, in block 604, memory module controller 300 may cease to power the first volatile memory device after data is copied from the first volatile memory device to non-volatile memory. In some implementations, memory module controller 300 may open the first switch. In some implementations, the first switch may include a FET, and memory module controller 300 may change the gate voltage of the FET to cause the FET to function as an open switch, as discussed above with respect to FIG. 5.

In block 606, memory module controller 300 may copy, after the first volatile memory device has ceased to be powered, data from a second volatile memory device on the memory module to non-volatile memory. For example, data may be copied from volatile memory device 104 to non-volatile memory 114. The second volatile memory device may be connected to a second switch. The second switch, when closed, may couple the second volatile memory device to a power source.

Finally, in block 608, memory module controller 300 may cease to power the second volatile memory device after data is copied from the second volatile memory device to non-volatile memory. In some implementations, memory module controller 300 may open the second switch. In some implementations, the second switch may include a FET, and memory module controller 300 may change the gate voltage of the FET to cause the FET to function as an open switch, as discussed above with respect to FIG. 5.

It should be understood that method 600 may include additional blocks in which data is copied from, and power is ceased to, additional volatile memory devices. For example, the power source may be a backup power source, and the first and second volatile memory devices, and a third volatile memory device, may be powered with the backup power source when a main power source is disconnected from the first, second, and third volatile memory devices. After the second volatile memory device has ceased to be powered, memory module controller 300 may copy data from the third volatile memory device to non-volatile memory. Memory module controller 300 may cease to power the third volatile memory device after data is copied from the third volatile memory device to non-volatile memory.

FIG. 7 is a flowchart of an example method 700 for determining when to cease power to a volatile memory device. Although execution of method 700 is described below with reference to memory module controller 400 of FIG. 4, it should be understood that execution of method 700 may be performed by other suitable devices, such as memory module controllers 300 and 500 of FIGS. 3 and 5, respectively. Some blocks of method 700 may be performed in parallel with and/or after method 600. Method 700 may be implemented in the form of executable instructions stored on a machine-readable storage medium and/or in the form of electronic circuitry.

Method 700 may start in block 702, where memory module controller 400 may power a plurality of volatile memory devices with a backup power source when a main power source is disconnected from the plurality of volatile memory devices. In block 704, memory module controller 400 may identify a first volatile memory device for data backup. In some implementations, memory module controller 400 may be programmed with an order in which volatile memory devices are to be copied during data backup, and may identify the first volatile memory device in such an order.

Next, in block 706, memory module controller 400 may copy data from the identified volatile memory device to non-volatile memory. In block 708, memory module controller 400 may determine whether the copying of data is complete. For example, memory module controller 400 may determine whether the full range of addresses of the identified volatile memory device has been read, or whether the amount of data that has been copied from the identified volatile memory device to non-volatile memory is equal to the capacity of the identified volatile memory device, as discussed above with respect to FIG. 4. If memory module controller 400 determines that the copying of data is not complete, method 700 may loop back to block 706.

If, in block 708, memory module controller 400 determines that the copying of data is complete, method 700 may proceed to block 710, in which memory module controller 400 may cease to power the volatile memory device whose data has been copied. For example, memory module controller 400 may open a switch that, when closed, couples the identified volatile memory device to a power source. In some implementations, the switch may include a FET, and memory module controller 400 may change the gate voltage of the FET to cause the FET to function as an open switch, as discussed above with respect to FIG. 5.

Next, in block 712, memory module controller 400 may determine whether there are additional volatile memory devices whose data has not been copied to non-volatile memory. For example, memory module controller 400 may maintain a counter for how many volatile memory devices have had their data copied to non-volatile memory, and memory module controller 400 may determine whether the counter value is equal to the number of volatile memory devices on the memory module on which memory module controller 400 is implemented. If, in block 712, memory module controller 400 determines that there are additional volatile memory devices whose data has not been copied to non-volatile memory, method 700 may proceed to block 714, in which memory module controller 400 may identify the next volatile memory device for data backup. Method 700 may then loop back to block 706. If, in block 712, memory module controller 400 determines that there are no additional volatile memory devices whose data has not been copied to non-volatile memory, method 700 may end in block 716.

FIG. 8 is a flowchart of an example method 800 for determining when to change a gate voltage of a FET. Although execution of method 800 is described below with reference to memory module controller 500 of FIG. 5, it should be understood that execution of method 800 may be performed by other suitable devices, such as memory module controllers 300 and 400 of FIGS. 3 and 4, respectively. Some blocks of method 800 may be performed in parallel with and/or after methods 600 and/or 700. Method 800 may be implemented in the form of executable instructions stored on a machine-readable storage medium and/or in the form of electronic circuitry.

Method 800 may start in block 802, where memory module controller 500 may copy data from a first volatile memory device on a memory module to non-volatile memory. The first volatile memory device may be connected to a first switch, which may include a FET. The first switch, when closed, may couple the first volatile memory device to a power source.

In block 804, memory module controller 500 may determine whether copying of data from the first volatile memory device to non-volatile memory is complete. For example, memory module controller 500 may determine whether the full range of addresses of the first volatile memory device has been read, or whether the amount of data that has been copied from the first volatile memory device to non-volatile memory is equal to the capacity of the first volatile memory device, as discussed above with respect to FIG. 4. If memory module controller 500 determines that copying of data from the first volatile memory device to non-volatile memory is not complete, method 800 may loop back to block 802.

If, in block 804, determines that copying of data from the first volatile memory device to non-volatile memory is complete, method 800 may proceed to block 806, in which memory module controller 500 may change the gate voltage of a FET connected to the first volatile memory device. For example, memory module controller 500 may change the gate voltage of the FET from a first value to a second value. The FET may function as a closed switch (e.g., the FET may couple the first volatile memory device to a power source) when its gate voltage is at the first value, and may function as an open switch (e.g., the first volatile memory device may be decoupled from the power source) when its gate voltage is at the second value.

Next, in block 808, memory module controller 500 may copy data from a second volatile memory device on the memory module to non-volatile memory. The second volatile memory device may be connected to a second switch, which may include a FET. The second switch, when closed, may couple the second volatile memory device to a power source.

In block 810, memory module controller 500 may determine whether copying of data from the second volatile memory device to non-volatile memory is complete. For example, memory module controller 500 may determine whether the full range of addresses of the second volatile memory device has been read, or whether the amount of data that has been copied from the second volatile memory device to non-volatile memory is equal to the capacity of the second volatile memory device, as discussed above with respect to FIG. 4. If memory module controller 500 determines that copying of data from the second volatile memory device to non-volatile memory is not complete, method 800 may loop back to block 808.

If, in block 810, memory module controller 500 determines that copying of data from the second volatile memory device to non-volatile memory is complete, method 800 may proceed to block 812, in which memory module controller 500 may change the gate voltage of a FET connected to the second volatile memory device. For example, memory module controller 500 may change the gate voltage of the FET from a first value to a second value. The FET may function as a closed switch (e.g., the FET may couple the second volatile memory device to a power source) when its gate voltage is at the first value, and may function as an open switch (e.g., the second volatile memory device may be decoupled from the power source) when its gate voltage is at the second value. It should be understood that method 800 may include additional blocks if a memory module on which memory module controller 500 is implemented includes additional volatile memory devices.

The foregoing disclosure describes power conservation during data backup. Example implementations described herein enable smaller backup power sources on memory modules, in terms of mechanical size and amount of energy stored, reducing costs and mechanical sizes of memory modules.

I claim:

1. A system comprising:
a first volatile memory device;
a second volatile memory device;
a first switch connected to the first volatile memory device;
a second switch connected to the second volatile memory device, wherein each of the first and second switches, when closed, couples the respective volatile memory device to a power source; and
a controller communicatively coupled to the first and second volatile memory devices and the first and second switches, wherein the controller is to:

open the first switch after data is copied from the first volatile memory device to non-volatile memory, and while the second switch is closed; and copy data from the second volatile memory device to the non-volatile memory after the first switch is opened.

2. The system of claim 1, wherein:
the first and second switches comprise first and second field-effect transistors (FETs), respectively; and
the controller is to control gate voltages of the first and second FETs.

3. The system of claim 1, wherein the power source comprises a battery or a supercapacitor.

4. The system of claim 1, wherein the controller comprises a field programmable gate array (FPGA) or a double data rate (DDR) buffer.

5. The system of claim 1, further comprising:
a third volatile memory device; and
a third switch connected to the third volatile memory device, wherein:
the power source is a backup power source; the first, second, and third volatile memory devices are coupled to the backup power source when a main power source ceases to power the first, second, and third volatile memory devices;
the third switch, when closed, couples the third volatile memory device to the backup power source;
the controller is to open the second switch after data is copied from the second volatile memory device to the non-volatile memory and while the third switch is closed; and
data is copied from the third volatile memory device to the non-volatile memory after the second switch is opened.

6. A memory module controller comprising instructions that cause the memory module controller to:
close a plurality of switches on a memory module, wherein:
each of the plurality of switches is connected to a respective one of a plurality of volatile memory devices on the memory module; and
each of the plurality of switches, when closed, couples the respective volatile memory device to a power source;
copy data from the plurality of volatile memory devices to non-volatile memory; and
open each of the plurality of switches after data is copied from the respective volatile memory device to the non-volatile memory, wherein:
switches connected to volatile memory devices, whose data has already been copied to the non-volatile memory, are open while switches connected to volatile memory devices, whose data has not yet been copied to the non-volatile memory, are closed.

7. The memory module controller of claim 6, wherein:
the power source is a backup power source; and
the plurality of volatile memory devices are coupled to the backup power source when a main power source ceases to power the plurality of volatile memory devices.

8. The memory module controller of claim 6, further comprising instructions that cause the memory module controller to:
determine whether copying of data from one of the plurality of volatile memory devices to the non-volatile memory has been completed; and
transmit, in response to a determination that copying of data from the one of the plurality of volatile memory devices to the non-volatile memory has been completed, a command to open the respective switch connected to the one of the plurality of volatile memory devices.

9. The memory module controller of claim 6, wherein the plurality of switches comprise field-effect transistors (FETs), the memory module controller further comprising instructions that cause the memory module controller to:
determine whether copying of data from one of the plurality of volatile memory devices to the non-volatile memory has been completed; and
change, in response to a determination that copying of data from the one of the plurality of volatile memory devices to the non-volatile memory has been completed, a gate voltage of a FET connected to the one of the plurality of volatile memory devices.

10. The memory module controller of claim 6, wherein the power source comprises a battery or a supercapacitor.

11. The memory module controller of claim 6, wherein the plurality of volatile memory devices comprises dynamic random-access memory (DRAM) devices.

12. A method comprising:
copying data from a first volatile memory device on a memory module to non-volatile memory;
ceasing to power the first volatile memory device after data is copied from the first volatile memory device to the non-volatile memory while powering a second volatile memory device on the memory module;
copying, after the first volatile memory device has ceased to be powered, data from the second volatile memory device on the memory module to the non-volatile memory; and
ceasing to power the second volatile memory device after data is copied from the second volatile memory device to the non-volatile memory.

13. The method of claim 12, wherein:
the first and second volatile memory devices are connected to first and second switches, respectively;
each of the first and second switches, when closed, couples the respective volatile memory device to a power source;
ceasing to power the first volatile memory device comprises opening the first switch; and
ceasing to power the second volatile memory device comprises opening the second switch.

14. The method of claim 13, wherein each of the first and second switches comprises a field-effect transistor (FET), the method further comprising:
determining whether copying of data from one of the first and second volatile memory devices to the non-volatile memory has been completed; and
changing, in response to a determination that copying of data from the one of the first and second volatile memory devices to the non-volatile memory has been completed, a gate voltage of a FET connected to the one of the first and second volatile memory devices.

15. The method of claim 12, wherein the power source is a backup power source, the method further comprising:
powering the first and second volatile memory devices and a third volatile memory device with the backup power source when a main power source is disconnected from the first, second, and third volatile memory devices;
copying, after the second volatile memory device has ceased to be powered, data from the third volatile memory device to the non-volatile memory; and ceasing to power the third volatile memory device after data is copied from the third volatile memory device to the non-volatile memory.

16. The system of claim 1, wherein opening the first switch after data is copied comprises opening the first switch in response to a determination that that a first copy of the data from the first volatile memory to the non-volatile memory is complete.

17. The system of claim 1, wherein opening the first switch causes the first volatile memory device to cease to be powered.

18. The system of claim 5, wherein opening the second switch after data is copied comprises opening the second switch in response to a determination that that a second copy of the data from the second volatile memory to the non-volatile memory is complete.

19. The system of claim 5, wherein opening the second switch causes the second volatile memory device to cease to be powered.

20. The system of claim 1, wherein the power source comprises a main power source and a backup power source.

\* \* \* \* \*